United States Patent

Song

[11] Patent Number: 6,166,968
[45] Date of Patent: Dec. 26, 2000

[54] SEMICONDUCTOR MEMORY HAVING A NEGATIVE VOLTAGE GENERATOR FOR AN ERASING OPERATION

[75] Inventor: Ju Hyeon Song, Chungcheongbuk-do, Rep. of Korea

[73] Assignee: Hyundai Electronics Industries Co., Ltd., Ichon, Rep. of Korea

[21] Appl. No.: 09/280,055

[22] Filed: Mar. 29, 1999

[30] Foreign Application Priority Data

Aug. 31, 1998 [KR] Rep. of Korea .................. 98-35673

[51] Int. Cl.⁷ .................................. G11C 5/14; G05F 1/10
[52] U.S. Cl. .................. 365/189.09; 365/226; 365/185.2; 365/185.29; 327/536; 327/537; 327/535; 327/530; 327/538; 327/540; 327/541; 327/543
[58] Field of Search ........................... 365/185.2, 185.29, 365/185.33, 189.09, 226; 327/530, 535, 536, 537, 538, 540, 541, 543

[56] References Cited

U.S. PATENT DOCUMENTS

| | | | |
|---|---|---|---|
| 4,945,267 | 7/1990 | Galbraith | 327/434 |
| 5,282,170 | 1/1994 | Van Buskirk et al. | 365/226 |
| 5,532,915 | 7/1996 | Pantelakis et al. | 363/60 |
| 5,815,356 | 9/1998 | Rodriguez et al. | 361/91.6 |

*Primary Examiner*—Andrew Q. Tran
*Attorney, Agent, or Firm*—Fleshner & Kim, LLP

[57] ABSTRACT

A voltage supply generator for a semiconductor memory improves the reliability of the erasing operation. A Vcc voltage detecting unit detects an intensity of a Vcc voltage, which is an external power source, to provide first and second Vcc voltages. A charge pump circuit receives the Vcc voltage and provides a VNEG voltage. A clock circuit applies a clock pulse to the charge pump circuit. A voltage regulating circuit receives the first and second Vcc voltages to monitor and control the VNEG voltage and provides a constant VNEG voltage.

22 Claims, 6 Drawing Sheets

SEMICONDUCTOR MEMORY HAVING A NEGATIVE VOLTAGE GENERATOR FOR AN ERASING OPERATION

BACKGROUND OF THE INVENTION

1. Field of the Invention

The present invention relates to a voltage supply to a semiconductor memory, and more particularly to a voltage supply to a semiconductor memory, which can supply a regulated voltage to the memory.

2. Background of the Related Art

In erasure of a flash EEPROM cell array, a negative voltage supply provides a negative regulated voltage to a control gate through a wordline. FIG. 1 illustrates a block diagram showing a related art negative voltage supply, FIG. 2 illustrates a voltage regulating circuit in the related art negative voltage supply, and FIG. 3 illustrates Vcc vs. VNEG in the negative voltage supply.

Referring to FIG. 1, the related art negative voltage supply is provided with a charge pump circuit 1 for providing a constant voltage, a clock circuit 2 for applying clock pulses to the charge pump circuit 1, a voltage regulating circuit 3 for monitoring (the voltage from the charge pump circuit 1 to keep enabling the charge pump circuit 1 until a desired voltage is provided and to generating a disenable signal if a voltage higher than the desired voltage to stop the charge pump.

Referring to FIG. 2, the voltage regulating circuit 3 is provided with a first, and a second current mirrors each for receiving an erasure operation signal and a driving voltage $V_{DD}$, a reference voltage $V_{REF}$ supply unit 13 for receiving the erasure operation signal, the driving voltage $V_{DD}$ and the reference voltage $V_{REF}$, a voltage distribution unit 14, a forwarding unit 15 for receiving the driving voltage $V_{DD}$ and forwarding a voltage VNEG of the negative voltage supply, and a first, and a second NMOS's N1 and N2 for receiving a high voltage signal HVON and an X address selecting signal XALLSEL. The first, and second current mirrors 11 and 12 are applied of a node A voltage in common. The node A is a cross point of the a common input line to the first, and second current mirrors 11 and 12 and a drain of the first NMOS N1. The reference voltage $V_{REF}$ supply unit 13 is provided with a first, and a second reference voltage suppliers 16 and 17 and a third, and a fourth NMOS N3 and N4 each having a grounded source. The first reference voltage supplier 16 is provided with a third PMOS P3 having a drain connected to the driving voltage $V_{DD}$ and a gate connected to an inverted erasing operation signal, and a plurality of resistors connected in series between a source of the third PMOS P3 and a ground voltage Vss, for providing a first reference voltage to one input terminal on the first current mirror 11. The second reference voltage supplier 17 is provided with a fifth NMOS N5, a first capacitor C1, and a second grounded capacitor C2, for providing a second reference voltage, outputs from the first, and second capacitors C1 and C2, to one input terminal on the second current mirror 12. The fifth NMOS N5 has a gate connected to the erasing operation signal through four first inverters i1, a source connected to the reference voltage $V_{REF}$, and a drain connected to a drain of the third NMOS N3 and the first capacitor C1. The first capacitor C2 is connected to the first capacitor C1. A gate of the third NMOS N3 is connected to the fourth NMOS N4, and a drain of the fourth NMOS N4 is connected to the second reference voltage. The voltage distribution unit 14 is provided with a third capacitor connected to the common input to the first, and second current mirrors 11 and 12, a third capacitor C3 connected to the VNEG, and a fourth capacitor C4 having one terminal connected to the common input to the first and second current mirror 11 and 12 and the other terminal grounded. The forwarding unit 15 is provided with a first, and a second PMOS's P1 and P2. The first PMOS P1 has a drain connected to the driving voltage $V_{DD}$, a source connected to the VNEG, and a gate connected to an output terminal to the first current mirror 11 through a second inverter i2. The second PMOS P2 has a drain connected to the driving voltage $V_{DD}$, a source connected to VNEG, and a gate connected to an output terminal on the second current mirror 12 through the third inverter i3. And, the first NMOS N1 has a drain connected to the node A, a source connected to a source of the second NMOS N2, and a gate to HVON through the fourth inverter i4. And, the second NMOS N2 has a drain connected to the $V_{REF}$, and a gate connected to XALLSEL through the fifth inverter i5.

The operation of the aforementioned voltage regulating circuit in the related art negative voltage supply will be explained.

When an erasing operation of the flash EEPROM cell array is started under a state the node A is precharged of a reference voltage $V_{REF}$ as the first, and second NMOS's N1 and N2 are turned-on because the HVON and XALLSEL are at low, the negative charge pump circuit 1 comes into operation, to increase the VNEG gradually and the voltage regulating circuit 3 is applied of the erasing operation signal. Upon application of the erasing operation signal to the voltage regulating circuit 3, the first, and second current mirrors 11 and 12 and the fifth NMOS N5 are turned on, bringing the voltage regulating circuit 3 into operation. In this instance, since HVON and XALLSEL are transited to high, turning off the first, and second NMOS N1 and N2, the node A is, not connected to the reference voltage reference $V_{REF}$, but becomes a coupling voltage through the third, and fourth capacitors C3 and C4 in the voltage distribution unit 14 due to VNEG. And, the first, and second current mirrors 11 and 12 respectively compare the first and second reference voltages to a node A voltage. Since an operative relation of the first current mirror 11, the second inverter i2, and the first PMOS P1 is the same with an operative relation of the second current mirror 12, the third inverter i3, and the second PMOS P2, the operative relation on the first current mirror 11, the second inverter i2, and the first PMOS P1 will only be explained. If VNEG is increased higher than a preset reference, i.e., the node A voltage is lower than the first reference voltage, the first current mirror 11 provides a high signal, a control signal, to the first PMOS P1 through the second inverter i2, to turn on the first PMOS P1. Upon turning on the first PMOS P1, $V_{DD}$ is applied to VNEG, decreasing the VNEG. The VNEG is kept decreased due to the application of $V_{DD}$ until VNEG comes below the preset reference, i.e., the node A voltage is higher than reference voltage $V_{REF}$, when the first current mirror 11 provides a low signal, a control signal, to the first PMOS P1 through the second inverter i2, turning off the first PMOS P1. Upon turning off the first PMOS P1, $V_{DD}$ can not be applied to VNEG, increasing the VNEG, again. In this instance, because an amount of charge supplied from the negative charge pump 1 differs significantly depending on power source voltage Vcc, the higher the power source voltage, the greater the current supply capability of the charge pump, also with a change of the coupling voltage. As the node A voltage is changed according to the change of the coupling voltage, as shown in FIG. 3, VNEG from the related art negative voltage supply is changed depending on power supply voltage Vcc.

Accordingly, the related art voltage supply to a semiconductor memory has a problem in that an erasing operation of a flash EEPROM cell array is not stable due to changes of VNEG depending on Vcc and in that a size of the voltage regulating circuit is large because of the use of the first, and second reference voltage suppliers and two current mirrors on the same time in which a capacitance distibutor and a resistance distributor are used for reducing a variation of the VNEG.

SUMMARY OF THE INVENTION

Accordingly, the present invention is directed to a voltage supply to a semiconductor memory that substantially obviates one or more of the problems due to limitations and disadvantages of the related art.

An object of the present invention is to provide a voltage supply to a semiconductor memory, in which the VNEG is not varied with the Vcc, thereby improving an erasure operation reliability of a flash EEPROM cell array.

Additional features and advantages of the invention will be set forth in the description which follows, and in part will be apparent from the description, or may be learned by practice of the invention. The objectives and other advantages of the invention will be realized and attained so by the structure particularly pointed out in the written description and claims hereof as well as the appended drawings.

To achieve these and other advantages and in accordance with the purpose of the present invention, as embodied and broadly described, the voltage supply to a semiconductor memory includes a Vcc detecting unit for detecting an intensity of a Vcc which is an external power source, to provide a first, and a second Vcc's, a charge pump circuit for receiving the Vcc and providing a VNEG, a clock circuit for applying a clock pulse to the charge pump circuit, and a voltage regulating circuit for receiving the first, and second Vcc's and monitoring, and controlling the VNEG, to provide a constant VNEG, for not varying the VNEG with the Vcc.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
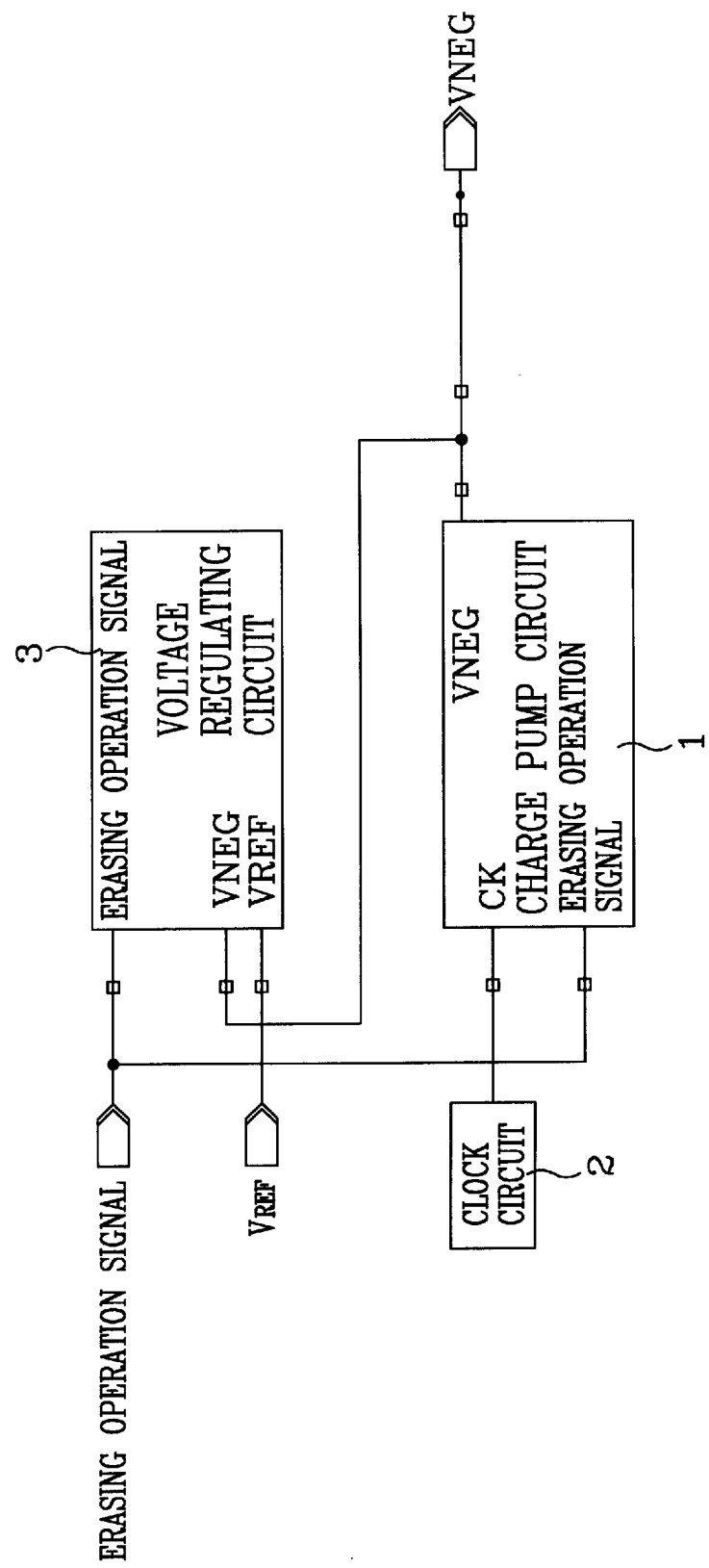
FIG. 1 illustrates a block diagram showing a related art negative voltage supply.
Figure 2:
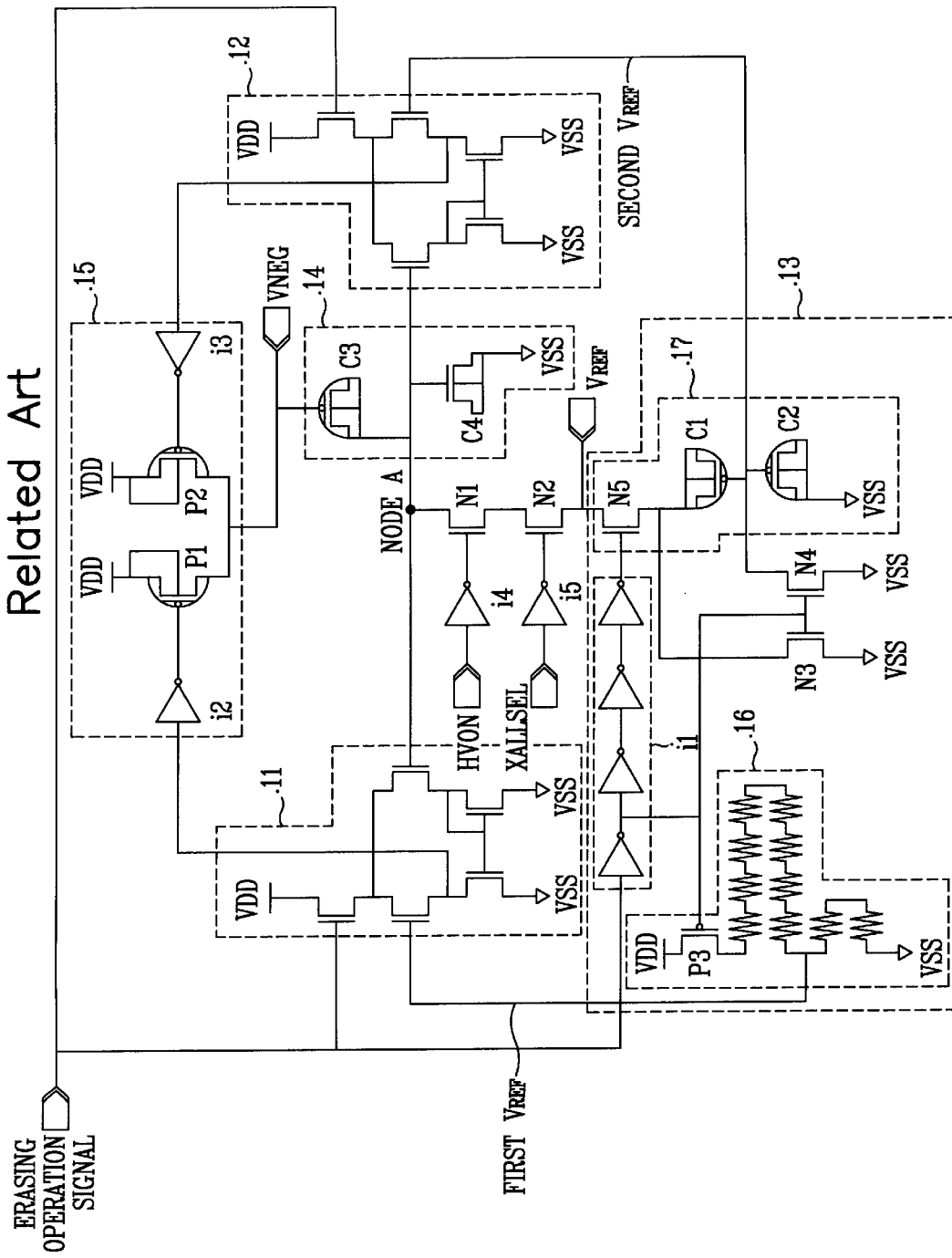
FIG. 2 illustrates a voltage regulating circuit in the related art negative voltage supply.
Figure 3:
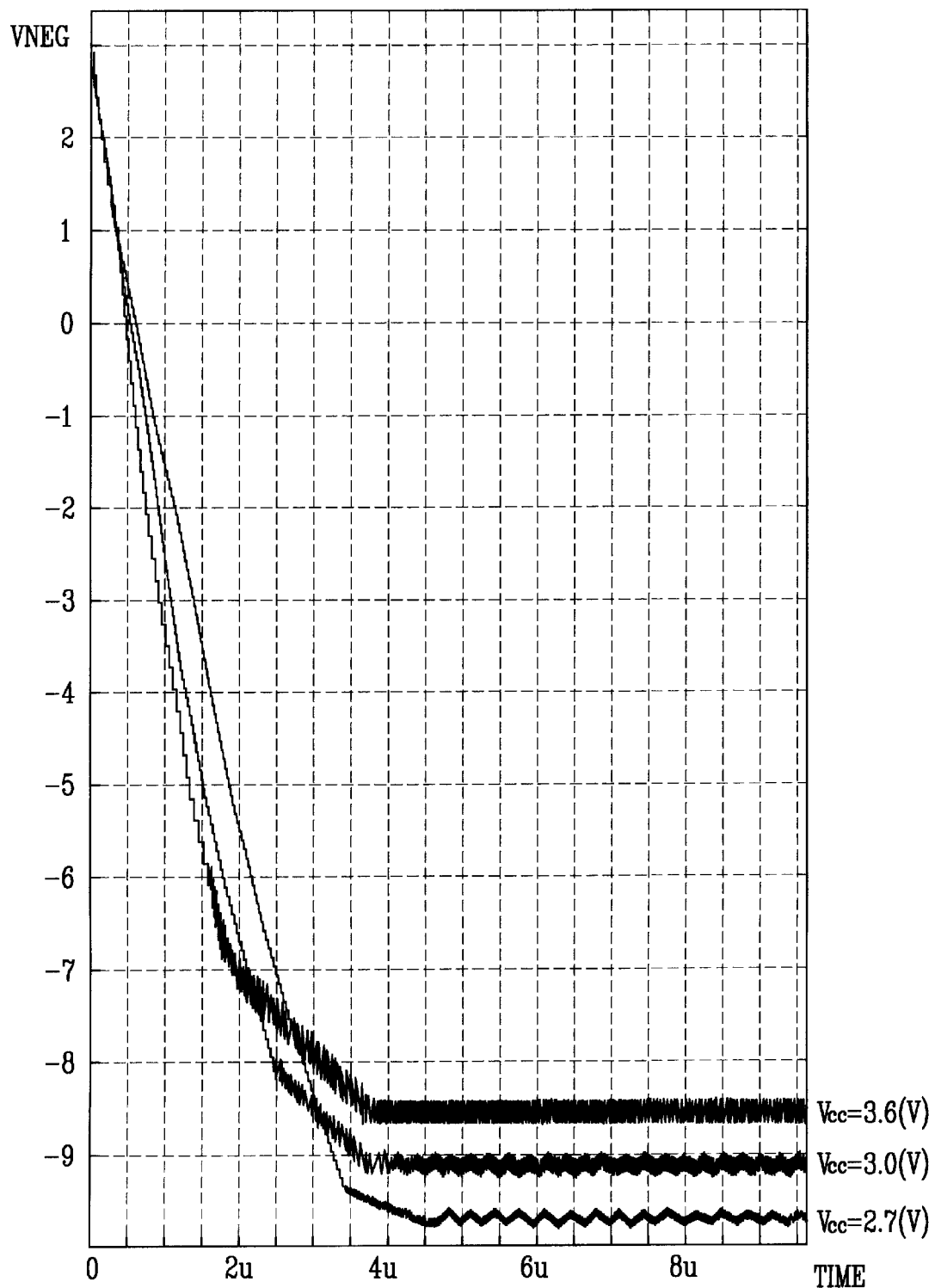
FIG. 3 illustrates Vcc vs. VNEG in the related art negative voltage supply.
Figure 4:
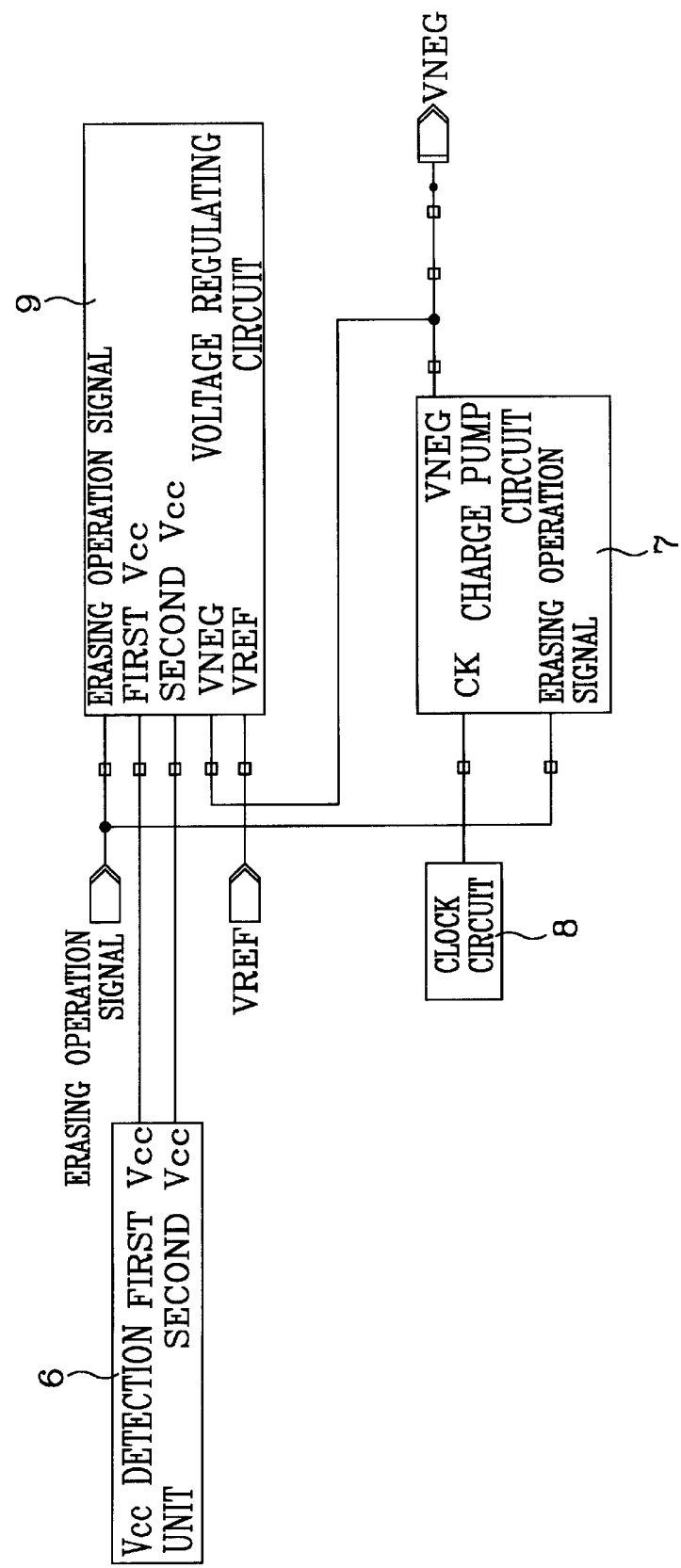
FIG. 4 illustrates a block diagram showing a negative voltage supply in accordance with a first preferred embodiment of the present invention.

Reference will now be made in detail to the preferred embodiments of the present invention, examples of which are illustrated in the accompanying drawings. FIG. 4 illustrates a block diagram showing a negative voltage supply in accordance with a first preferred embodiment of the present invention, FIG. 5 illustrates a voltage regulating circuit in the negative voltage supply in accordance with a first preferred embodiment of the present invention, and FIG. 6 illustrates Vcc vs. VNEG in the negative voltage supply in accordance with a first preferred embodiment of the present invention.

Referring to FIG. 4, the negative voltage supply in accordance with a first preferred embodiment of the present invention includes a Vcc detecting unit 6 for providing a first, and a second Vcc's, a charge pump circuit 7 for providing a regulated voltage, a clock circuit 8 for applying a clock pulse to the charge pump circuit 7, and a voltage regulating circuit 9 for receiving the first, and second Vcc's and monitoring a voltage from the charge pump circuit 7, to keep enabling of charge pumping until a desired voltage is obtained and to stop the charge pumping by providing a disenable signal when a voltage higher than the desired voltage is obtained.

Figure 5:
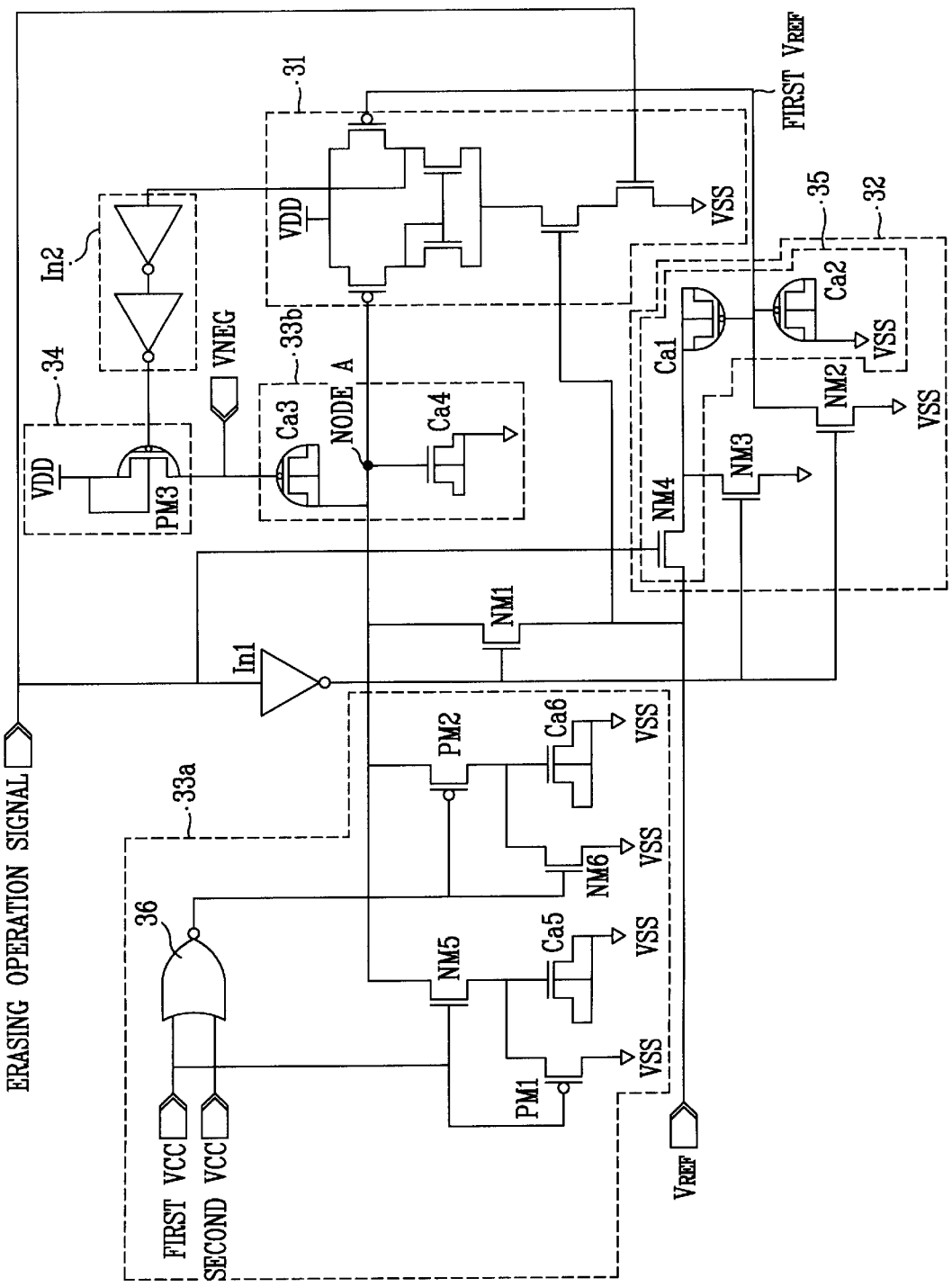
FIG. 5 illustrates a voltage regulating circuit in the negative voltage supply in accordance with a first preferred embodiment of the present invention; and, FIG. 6 illustrates Vcc vs. VNEG in the negative voltage supply in accordance with a first preferred embodiment of the present invention.
Figure 6:
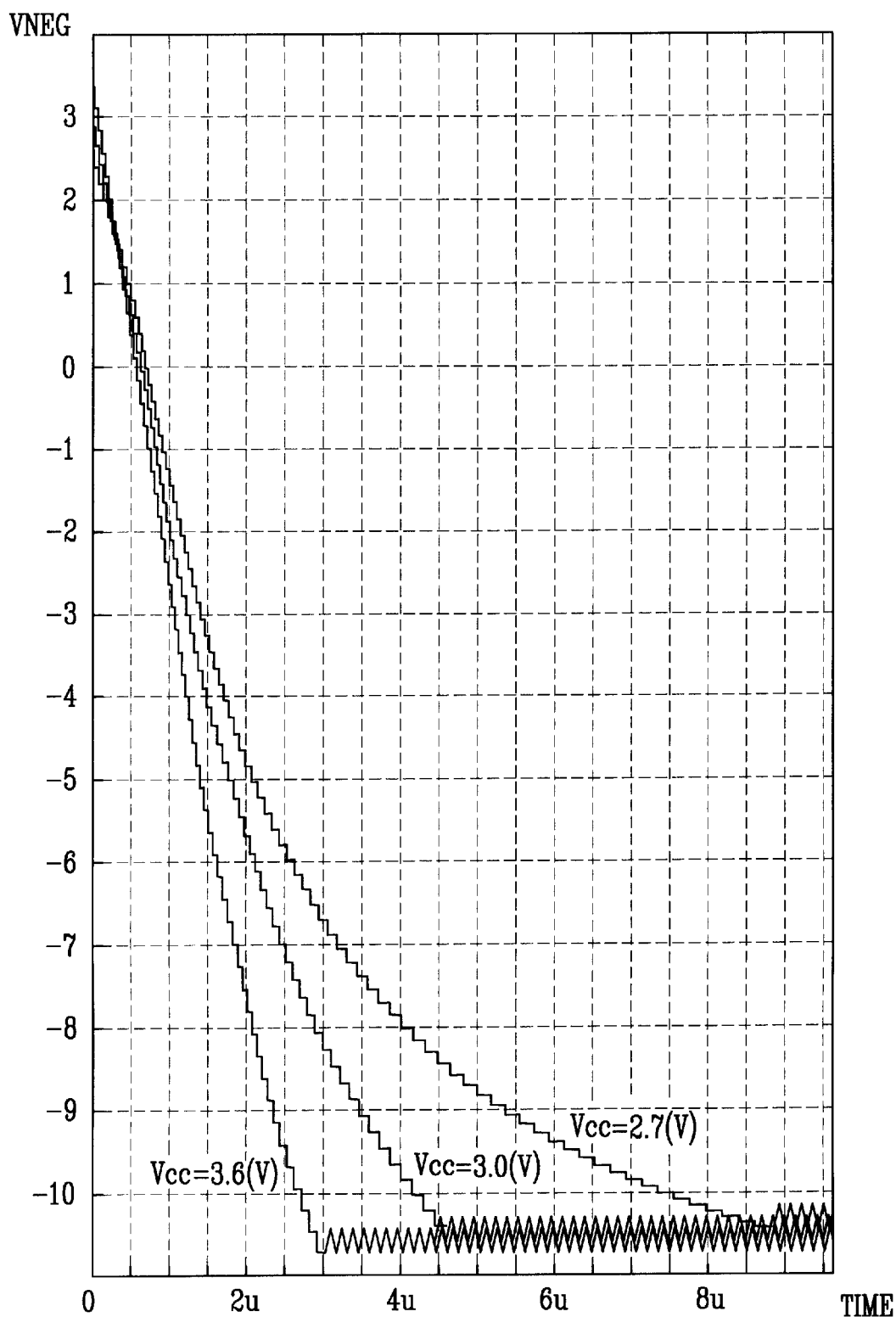

Referring to FIG. 5, the regulating circuit 9 includes a first and second voltage distribution blocks 33a, 33b having a current mirror 31, a $V_{REF}$ supply unit 32, and a fourth capacitor Ca4, a forwarding unit, and a first NMOS NM1. The current mirror 31 is adapted to be applied of a voltage from a node A, which is a crossing point of one input line to the current mirror 31 and the fourth capacitor Ca4. The $V_{REF}$ supply unit 32 has a $V_{REF}$ supplier 35, a second, and a third NMOS's NM2 and NM3 each having a grounded source. The $V_{REF}$ supplier 35 has a fourth NMOS NM4, a first capacitor Ca1, and a grounded second capacitor Ca2, for providing a first $V_{REF}$ to one input terminal on the current mirror 31. The fourth NMOS NM4 has a gate connected to an erasing operation signal, a source connected to the $V_{REF}$, and a drain connected to a drain of the third NMOS NM3 and the first capacitor Ca1. The second capacitor Ca2 is connected to the first capacitor Ca1, and an output of the first, and second capacitors Ca1 and Ca2 is the first $V_{REF}$. A drain of the second NMOS NM2 is connected to the first $V_{REF}$, and gates of the second, and third NMOS's NM2 and NM3 are connected to the erasing operation signal through a first inverter In1, in common. The first voltage distributing block 33a has a third capacitor Ca3 having one terminal connected to an input line to the current mirror 31 from the node A opposite to an input line to the current mirror 31 from the first $V_{REF}$ and the other terminal connected to the VNEG, and a fourth capacitor having one terminal connected to the input to the current mirror 31 from the node A and the other terminal connected to Vss. And, the second voltage distributing block 33b has a fifth, and a sixth NMOS's NM5 and NM6, a first, and a second PMOS's PM1 and PM2, a fifth, and a sixth capacitors Ca5 and Ca6, both of which are grounded, and an NOR gate 36 for receiving the first, and second Vcc. The fifth NMOS NM5 has a drain connected both to an input line to the current mirror 31 from the node A and a drain of the second PMOS PM2, a source connected to a drain of the first PMOS PM1 and the fifth capacitor Ca5, and a gate connected to the first Vcc in common with the first PMOS PM1. The second PMOS PM2 has a source connected both to a drain of the sixth PMOS NM6 and the sixth capacitor Ca6, a gate connected to an output of the NOR gate 36 in common with a gate of the sixth NMOS NM6. Sources of the first PMOS PM1 and the sixth NMOS NM6 are connected to the Vss. The forwarding unit 34 has a third PMOS PM3 The third PMOS PM3 has a drain connected to the $V_{DD}$, a source connected to the VNEG, and a gate connected to an output of the current mirror 31 through two second inverters In2. The first NMOS NM1 has a drain connected to an input line to the current mirror 31 from the node A, a source connected to the $V_{REF}$, and a gate connected to the erasing operation signal through a first inverter In1.

The operation of the aforementioned voltage regulating circuit in accordance with a preferred embodiment of the present invention will be explained.

When an erasing operation of the flash EEPROM cell array is started under a state the node A is precharged of a reference voltage $V_{REF}$ with the first NMOS NM1 turned-on and the fourth NMOS NM4 turned-off as the erasing operation signal at low, the negative charge pump circuit 7 comes into operation, to increase the VNEG gradually, and the voltage regulating circuit 9 is applied of the erasing operation signal. Because a charge supply amount from the negative charge pump circuit differs significantly depending on the Vcc, i.e., the lighter the Vcc, the greater the current supply capability, in order to prevent variation of the VNEG depending on the Vcc, the Vcc detecting unit 6 provides the first, and second Vcc's of a high or low values respectively depending on the Vcc to the voltage regulating circuit 9, and the voltage regulating circuit 9, upon receiving the first, and second Vcc's at the second voltage distributing unit 33b, controls application of outputs of the third, and fourth capacitors Ca3 and Ca4 to the node A, thereby keeping the VNEG constant regardless of the Vcc as shown in FIG. 6. Upon application of the erasing operation signal to the voltage regulating circuit 9, the first, second, and third NMOS's NM1, NM2, and NM3 are turned off, and the fourth NMOS NM4 and the current mirror 31 are turned on, to put the voltage regulating circuit 9 into operation. In this instance, as the first NMOS NM1 is turned off, a voltage at the node A is not connected to the $V_{REF}$, but passes through the first and second voltage distributing blocks 33a, 33b and becomes a coupling voltage by the VNEG. And, the current mirror 31 compares the first $V_{REF}$ and the node A voltage. As a result of the comparison, if it is found that the VNEG is higher than a preset reference, i.e., the node A voltage is lower than the first $V_{REF}$, the current mirror 31 provides a high signal, a control signal, to the first PMOS PM1 through the second inverter In2, to turn on the third PMOS PM3. When the third PMOS PM3 is turned on, the $V_{DD}$ is applied to the VNEG, dropping the VNEG. Contrary to this, if it is found that the VNEG is lower than the preset reference, i.e., the node A voltage is higher than the first $V_{REF}$, the current mirror 31 provides a low signal, a control signal, to the third PMOS PM3 through the second inverter In2, to turn off the third PMOS PM3. When the third PMOS PM3 is turned off, the $V_{DD}$ can not be applied to the VNEG, raising the VNEG, again.

The voltage supply to a semiconductor memory of the present invention has advantages in that the VNEG is not varied with the Vcc because the voltage supply is provided with a Vcc detecting unit providing a first, and a second Vcc's, information on the Vcc, to the voltage regulating circuit so that the voltage distribtiting ulnit is controlled according to the first, and second Vcc, keeping a coupling voltage constant without varying the VNEG with Vcc, and in that a size of the voltage regulating circuit can be made smaller because the first, and second $V_{REF}$'s supplies and the two current mirrors in which capacitor distributers and resistor distributers are used are not used for reducing a variation of the VNEG.

It will be apparent to those skilled in the art that various modifications and variations can be made in the voltage supply to a semiconductor memory of the present invention without departing from the spirit or scope of the invention. Thus, it is intended that the present invention cover the modifications and variations of this invention provided they come within the scope of the appended claims and their equivalents.

What is claimed is:

1. A regulating device for providing a voltage supply to a memory device, comprising:

a voltage detection circuit coupled for receiving an external voltage supply and generating a prescribed first voltage and a prescribed second voltage;

a charge pump circuit coupled for receiving a control signal and generating the voltage supply in response to the control signal; and a voltage regulating circuit coupled to the voltage detection circuit and the charge pump circuit for receiving the prescribed first voltage, the prescribed second voltage, the voltage supply, the control signal and a reference voltage, to monitor and regulate the voltage supply to the memory device at a substantially constant level.

2. The regulating device of claim 1, wherein the control signal comprises an erasing operation signal.

3. The regulating device of claim 1, wherein the voltage supply comprises a negative voltage.

4. The regulating device of claim 1, wherein the charge pump circuit is coupled for receiving a synchronization signal.

5. The regulating device of claim 1, wherein the voltage regulating circuit comprises:

a first voltage distributing circuit coupled for receiving the prescribed first voltage and the prescribed second voltage, and receiving and storing one of the voltage supply and the reference voltage based on the control signal, the prescribed first voltage and the prescribed second voltage;

a second voltage distributing circuit coupled to the first voltage distributing circuit for receiving and storing one of the voltage supply and the reference voltage based on the control signal;

a reference voltage supply circuit coupled for receiving the reference voltage and the control signal, that generates a third voltage in response to the control signal;

a current mirror circuit coupled to the second voltage distributing circuit and the reference voltage supply circuit for generating a fourth voltage in response to the voltage supply, the third voltage, the control signal and the reference voltage; and a forwarding circuit coupled in series between the current mirror circuit and the second voltage distributing circuit for generating a fifth voltage based on the fourth voltage.

6. The regulating device of claim 5, wherein the voltage supply is a negative voltage, and the fifth voltage is applied to the second voltage distributing circuit to regulate the voltage supply.

7. The regulating device of claim 5, wherein the first voltage distributing circuit comprises:

a logic gate coupled for receiving the prescribed first voltage and the prescribed second voltage and generating a logical output signal;

a first transistor coupled for receiving the prescribed first voltage at a control electrode and receiving one of the voltage supply and the reference voltage at a first electrode based on the control signal;

a second transistor coupled for receiving the logical output signal at a control electrode and receiving one of the voltage supply and the reference voltage at a first electrode based on the control signal;

a first capacitive load coupled to a second electrode of the first transistor for receiving one of the voltage supply and the reference voltage based on the control signal; and a second capacitive load coupled to a second electrode of the second transistor for receiving one of the voltage supply and the reference voltage based on the control signal.

8. The regulating device of claim 5, wherein the second voltage distributing circuit comprises:

a first capacitive load coupled to the forwarding circuit, that receives one of the voltage supply, the reference voltage, and the fifth voltage based on the control signal; and a second capacitive load coupled in series between the first capacitive load and a ground potential for receiving one of the voltage supply, the reference voltage and the fifth voltage.

9. The regulating device of claim 5, wherein the reference voltage supply circuit comprises:

a first transistor coupled for receiving the control signal at a control electrode and the reference voltage at a first electrode;

a first capacitive load coupled to a second electrode of the first transistor for receiving the reference voltage in accordance with the control signal; and a second capacitive load coupled in series between the first capacitive load and a ground potential, wherein the third voltage is generated at a node between the first capacitive load and the second capacitive load.

10. The regulating device of claim 5, wherein the current mirror circuit comprises:

a first transistor coupled for receiving the control signal at a control electrode and the fourth voltage at a first electrode;

a second transistor coupled for receiving the third voltage at a control electrode and the external voltage supply at a first electrode, and outputting the fourth voltage to the forwarding circuit at a second electrode;

a third transistor coupled in series with the first transistor for receiving the reference voltage at a control electrode, and receiving the fourth voltage at a first electrode; and a fourth transistor coupled in parallel with the second transistor for receiving one of the reference voltage and the voltage supply at a control electrode based on the control signal, and receiving the external voltage supply at a first electrode.

11. The regulating device of claim 5, wherein the forwarding circuit comprises a transistor coupled between the current mirror circuit and the second voltage distribution circuit for receiving the fifth voltage at a first electrode, receiving the fourth voltage at a control electrode, and outputting the fifth voltage to the second voltage distribution circuit in response to the fourth voltage.

12. The regulating device of claim 1, wherein the voltage regulating circuit is in an operational state when the control signal is transited to a "HIGH" level.

13. The regulating device of claim 1, wherein the voltage supply remains at a substantially constant level regardless of the external voltage supply.

14. A voltage regulating circuit for a memory device, comprising:

a first voltage distributing circuit coupled for receiving a prescribed first voltage and a prescribed second voltage, and receiving and storing one of a third voltage and a reference voltage based on a control signal, the prescribed first voltage, and the prescribed second voltage;

a second voltage distributing circuit coupled to the first voltage distributing circuit for receiving and storing one of the third voltage and the reference voltage based on the control signal;

a reference voltage supply circuit coupled for receiving the reference voltage and the control signal, that generates a fourth voltage in response to the control signal;

a current mirror circuit coupled to the second voltage distributing circuit and the reference voltage supply circuit for generating a fifth voltage in response to the third voltage, the fourth voltage, the control signal and the reference voltage; and a forwarding circuit coupled in series between the current mirror circuit and the second voltage distributing circuit for generating a sixth voltage based on the fifth voltage.

15. The voltage regulating circuit of claim 14, wherein the third voltage is a negative voltage, and the sixth voltage is applied to the second voltage distributing circuit to regulate the third voltage.

16. The voltage regulating circuit of claim 14, wherein the first voltage distributing circuit comprises:

a logic gate coupled for receiving the prescribed first voltage and the prescribed second voltage and generating a logical output signal;

a first transistor coupled for receiving the prescribed first voltage at a control electrode and receiving one of the third voltage and the reference voltage at a first electrode based on the control signal;

a second transistor coupled for receiving the logical output signal at a control electrode and receiving one of the third voltage and the reference voltage at a first electrode based on the control signal;

a first capacitive load coupled to a second electrode of the first transistor for receiving one of the third voltage and the reference voltage based on the control signal; and a second capacitive load coupled to a second electrode of the second transistor for receiving one of the third voltage and the reference voltage based on the control signal.

17. The voltage regulating circuit of claim 14, wherein the second voltage distributing circuit comprises:

a first capacitive load coupled to the forwarding circuit, that receives one of the third voltage, the reference voltage, and the sixth voltage based on the control signal; and a second capacitive load coupled in series between the first capacitive load and a ground potential for receiving one of the third voltage, the reference voltage and the sixth voltage.

18. The voltage regulating circuit of claim 14, wherein the reference voltage supply circuit comprises:

a first transistor coupled for receiving the control signal at a control electrode and the reference voltage at a first electrode;

a first capacitive load coupled to a second electrode of the first transistor for receiving the reference voltage in accordance with the control signal; and a second capacitive load coupled in series between the first capacitive load and a ground potential wherein the fourth voltage is generated at a node between the first capacitive load and the second capacitive load.

19. The voltage regulating circuit of claim 14, wherein the current mirror circuit comprises:

a first transistor coupled for receiving the control signal at a control electrode and the fifth voltage at a first electrode;

a second transistor coupled for receiving the fourth voltage at a control electrode and an external voltage supply at a first electrode, and outputting the fifth voltage to the forwarding circuit at a second electrode;

a third transistor coupled in series with the first transistor for receiving the reference voltage at a control electrode, and receiving the fifth voltage at a first electrode; and a fourth transistor coupled in parallel with the second transistor for receiving one of the reference voltage and the third voltage at a control electrode based on the control signal, and receiving the external voltage supply at a first electrode.

20. The voltage regulating circuit of claim 14, wherein the forwarding circuit comprises a transistor coupled between the current mirror circuit and the second voltage distribution circuit for receiving the sixth voltage at a first electrode, receiving the fifth voltage at a control electrode, and outputting the sixth voltage to the second voltage distribution circuit in response to the fifth voltage.

21. The voltage regulating circuit of claim 14, wherein the voltage regulating circuit is in an operational state when the control signal is transited to a "HIGH" level.

22. The voltage regulating circuit of claim 14, wherein the third voltage remains at a substantially constant level regardless of an external voltage supply.

* * * * *